United States Patent [19]
Arai et al.

[11] Patent Number: 5,298,455
[45] Date of Patent: Mar. 29, 1994

[54] METHOD FOR PRODUCING A NON-SINGLE CRYSTAL SEMICONDUCTOR DEVICE

[75] Inventors: Michio Arai; Masaaki Ikeda; Kazushi Sugiura; Nobuo Furukawa, all of Tokyo; Mitsufumi Kodama, Kanagawa; Yukio Yamauchi, Kanagawa; Naoya Sakamoto, Kanagawa; Takeshi Fukada, Kanagawa; Masaaki Hiroki, Kanagawa; Ichirou Takayama, Kanagawa, all of Japan

[73] Assignee: TDK Corporation, Tokyo, Japan

[21] Appl. No.: 825,552

[22] Filed: Jan. 27, 1992

[30] Foreign Application Priority Data

Jan. 30, 1991 [JP] Japan .................. 3-029411
Jan. 30, 1991 [JP] Japan .................. 3-029412

[51] Int. Cl.$^5$ .................. H01L 21/00; H01L 21/02; H01L 21/20
[52] U.S. Cl. .................. 437/109; 437/2; 437/4; 437/108
[58] Field of Search .................. 437/2, 4, 108, 109

[56] References Cited

U.S. PATENT DOCUMENTS

4,363,828 12/1982 Brodsky et al. .................. 437/238
4,693,759 9/1987 Noguchi et al. .................. 437/24
4,814,292 3/1989 Sasaki et al. .................. 437/101

FOREIGN PATENT DOCUMENTS

0310702 4/1989 European Pat. Off. .
0383230 8/1990 European Pat. Off. .
0093663 5/1986 Japan .

OTHER PUBLICATIONS

Scheid et al., Japanese Journal Of Applied Physics, vol. 29, No. 11, Nov. 1990, Tokyo JP, pp. L2105-L2107.
Katoh, IEEE Transactions On Electron Devices, vol. 35, No. 7, Jul. 1988, New York US pp. 923-928.
Nakanishi et al., Extended Abstracts, vol. 90, No. 1, May 1990, Princeton, N.J. US pp. 489-490.
Sze, VLSI Technology, McGraw-Hill, 1988, pp. 233-235.
Kurihara, Completely Integrated Contact-Type Linear A-Si/A-SiC 23rd Meeting in 147th Committee of Heterojunction Image Sensor, Amorphous Material in Japan Science Promotion Association, Mar. 1989, pp. 7-12.

Primary Examiner—Brian E. Hearn
Assistant Examiner—B. Everhart
Attorney, Agent, or Firm—Martin Novack

[57] ABSTRACT

A MOS-FET transistor is produced on a substrate made of glass which has a non single crystal semiconductor film (2'). The average diameter of a crystal grain in said film is in the range between 0.5 times and 4 times of thickness of said film, and said average diameter is 250 Å-8000 Å, and said film thickness is 500 Å-2000 Å. The density of oxygen in the semiconductor film (2') is less than $2 \times 10^{19}/cm^3$. A photo sensor having PIN structure is also produced on the substrate, to provide an image sensor for a facsimile transmitter together with the transistors. Said film (2') is produced by placing amorphous silicon film on the glass substrate through CVD process using disilane gas, and effecting solid phase growth to said amorphous silicon film by heating the substrate together with said film in nitrogen gas atmosphere. The film (2') thus produced is subject to implantation of dopant for providing a transistor. The film thus produced has high mobility which provides high speed operation of a transistor, and low threshold voltage of a transistor.

4 Claims, 13 Drawing Sheets

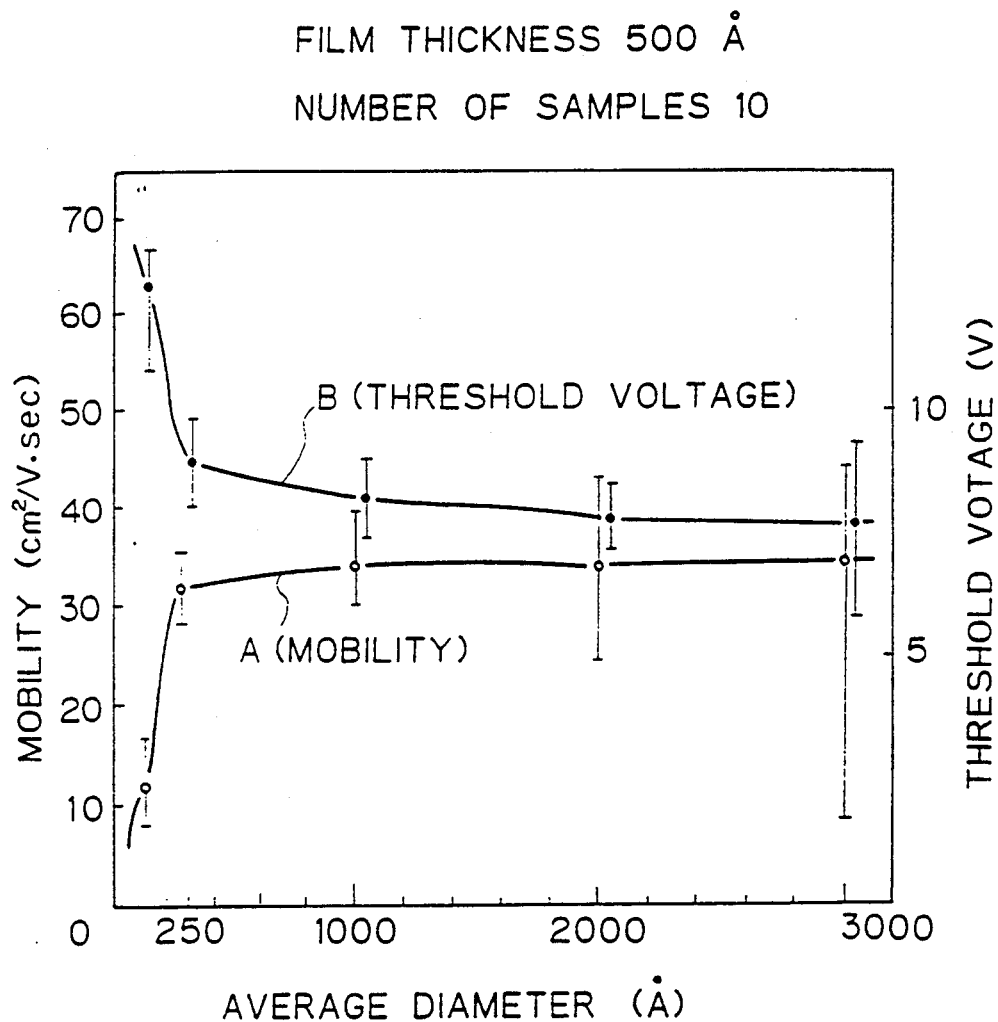

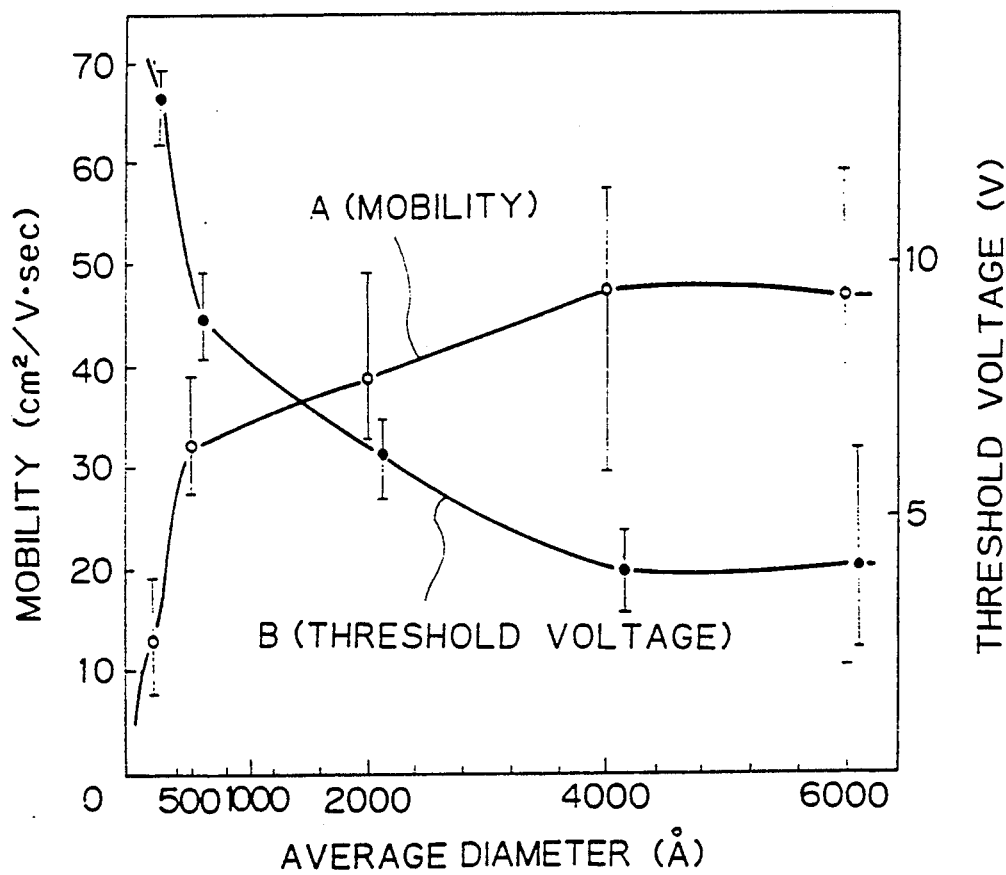

METHOD FOR PRODUCING A NON-SINGLE CRYSTAL SEMICONDUCTOR DEVICE

BACKGROUND OF THE INVENTION

The present invention relates to a non single crystal semiconductor device, in particular, relates to a thin film transistor (TFT) which has a substrate made of glass, and a thin film made of non single crystal silicon deposited on the substrate.

A thin film transistor (TFT) has been used in an image sensor used in a facsimile device, and/or a liquid crystal display panel. A thin film transistor is produced in a non single crystal semiconductor film, which is polycrystal silicon layer deposited on a substrate of quartz or glass.

When a substrate is made of quartz, a transistor is produced on the substrate through high temperature process up to 900° C.

However, a quartz substrate has the disadvantage that the price of the substrate is high, and the high price of the substrate increases the price of a semiconductor device itself.

When a substrate is glass, a transistor is produced on the substrate through relatively low temperature up to 600° C., because glass is softened or melted if temperature is higher than 600° C. In this case, a non single crystal film is produced on a glass substrate through low temperature process up to 600° C.

Conventionally, a non single crystal film, or an active layer of a MOS transistor, is produced through the steps of growing amorphous silicon layer on a substrate through plasma CVD process or low pressure CVD process (LPCVD) which uses silane gas (SiH4), and effecting solid phase growth to said amorphous film.

As for solid phase growth, a long time aneal process, and a laser aneal process have been known.

In a long time aneal process, an amorphous film is heated at temperature 550° C.–600° C. in nitrogen gas atmosphere for 8–56 hours so that an amorphous film is crystalized. A MOSFET transistor produced in an active layer produced through said long time aneal process has the mobility up to 35 cm$^2$/V·sec in an N-channel. But the mobility in P-channel is only 10 cm$^2$/V·sec. Generally speaking, the higher the mobility is, the higher the switching speed of a transistor is, and it is desirous that the mobility is higher than 25 cm$^2$/V·sec. Further, it has the disadvantage that the threshold voltage of the transistor is about 17 V, which is undesirably quite high. The threshold voltage is defined as gate voltage which switches a transistor, and the preferable threshold voltage is less than 10 Volts. Therefore, the long time aneal process is not suitable both in the mobility, and the threshold voltage.

In a laser aneal process, an amorphous film is crystalized by illuminating and heating the same with a laser beam spot. The mobility in an active layer produced through the laser aneal process is quite high up to 100 cm$^2$/V·sec in both P-channel and N-channel. However, the laser aneal process has the disadvantage that it is difficult to produce a large active film for a large display screen or a large line sensor, since a laser beam is a small spot, and it is impossible to heat the amorphous film uniformly.

SUMMARY OF THE INVENTION

It is an object of the present invention to provide a new and improved non single crystal semiconductor device by overcoming the disadvantages and limitations of a prior non single crystal semiconductor device.

It is also an object of the present invention to provide a non single crystal semiconductor device which is produced on a glass substrate, and has higher switching speed and higher mobility.

It is also an object of the present invention to provide a non single crystal semiconductor device having large area.

It is also an object of the present invention to provide a C-MOS transistor on a glass substrate.

It is also an object of the present invention to provide an image sensor having photosensors and thin film transistors.

The above and other objects are attained by a non single crystal semiconductor device comprising a substrate made of glass; a non single crystal semiconductor film placed on said substrate; at least one MOS transistor deposited on said film which is subject to be doped with dopant; and average diameter of a grain in said film being in the range between half and 4 times of thickness of said film.

Said semiconductor device is produced by the steps of placing amorphous silicon film on a glass substrate through CVD process using disilane gas; effecting solid phase growth to said amorphous silicon film by heating said substrate together with said film in nitrogen gas atmosphere; producing an insulation film on said solid phase growth film; implanting donor into said solid phase growth film close to said insulation film; and placing a conductive film on said insulation film.

BRIEF DESCRIPTION OF THE DRAWINGS

The foregoing and other objects, features, and attendant advantages of the present invention will be appreciated as the same become better understood by means of the following description and accompanying drawings wherein;

FIG. 2 shows curves of mobility and threshold voltage for each average grain diameter when film thickness is 500 Å, FIG. 3 shows the curves of mobility and threshold voltage for each average grain diameter when film thickness is 1000 Å.

DESCRIPTION OF THE PREFERRED EMBODIMENT

FIG. 1 shows the producing steps of a thin film transistor (TFT) on a glass substrate. The embodiment is described for a CMOS-FET as an example of a TFT.

A glass substrate must have the characteristics that it does not contract or reduce dimension at temperature 600° C. Preferably, the size of glass does not reduce more than 5 μm/30 cm when glass is heated to 600° C. for a long time. One of the glass which satisfy that requirement is Neo-ceram glass (trade name) manufactured by Nippon Electric Glass Company. That glass has the following compositions.

TABLE 1

Figure 1A:
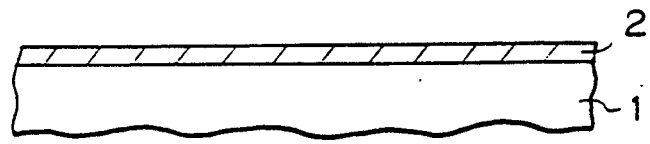
FIG. 1 (a)-1(h) shows producing steps of a C-MOS transistor according to the present invention.

|  | Composition (%) |
|---|---|
| Silica (SiO$_2$) | 67 |
| Alumina (Al$_2$O$_3$) | 23 |
| Lithium oxide (Li$_2$O) | 4 |
| Titanium oxide (TiO$_2$) | 2 |
| Zirconium oxide (ZrO$_2$) | 3 |
| Phosphorus oxide (P$_2$O$_5$) | 1 | a) First, an amorphous silicon film 2 is deposited on the glass substrate 1 by the thickness about 1000 Å through the low pressure CVD (Chemical Vapour Deposition) process which uses disilane gas (Si$_2$H$_6$) (see FIG. 1(a)).

The conditions for that process are as follows.

| Si$_2$H$_6$ gas | 100 SCCM (standard cubic centimeter/minute) |
|---|---|
| Pressure | 0.3 Torr |
| He gas | 200 SCCM |
| Temperature | 450° C.–570° C. |
| Growth rate of film | 50 Å–500 Å/minute |

The amorphous silicon film 2 is subject to solid phase growth process in the nitrogen gas atmosphere at temperature 550° C.–600° C. for 8–56 hours so that the solid phase growth film 2' is obtained. The solid phase growth film 2' has crystal grains.

b) Next, An SiO$_2$ insulation film 3 is placed on the solid phase growth film 2' through RF (radio frequency) sputtering process. Then, openings for the space for transistors are provided by selectively removing SiO$_2$ film through conventional photolithoetching process (see FIG. 1(b)).

c) Next, another SiO$_2$ film 4' for a gate film of a transistor is placed. Preferably, said oxide film 4' is produced through sputter process so that the withstand voltage of a transistor is high, and the density of interface trap is low because of coupling of interfaces with hydrogen.

The conditions for sputter process of gate film are as follows.

| Oxygen pressure | 4 mm Torr |
|---|---|
| Power consumption | 1.5 KW |
| Temperature | 150° C. |
| Length between a target and a substrate; | 150 mm |
| Film thickness | 500 Å–1500 Å |

Figure 1B:
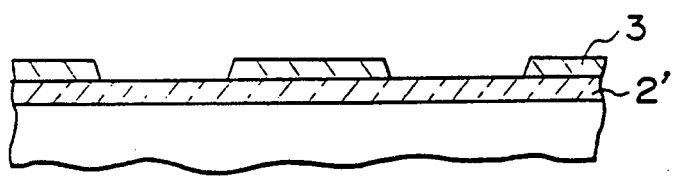
Figure 1C:
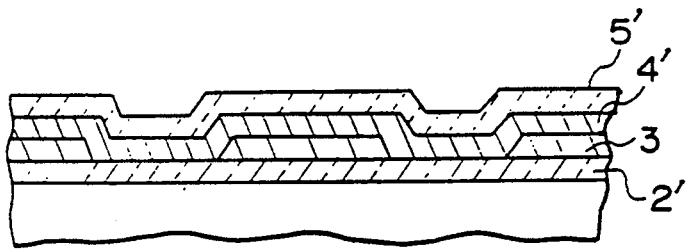
Figure 1D:
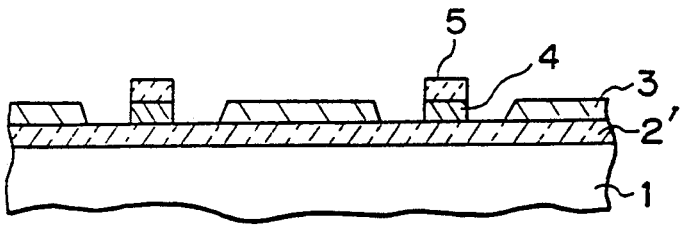
Figure 1E:
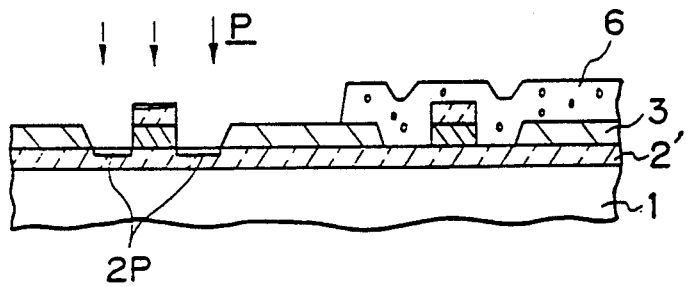
Figure 1F:
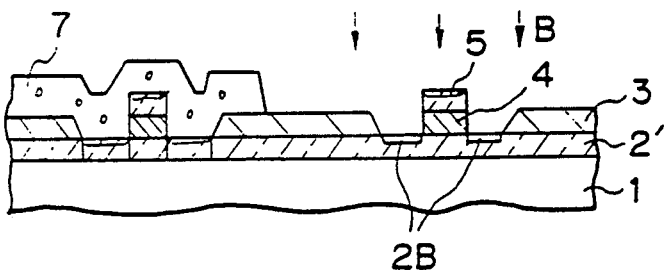
Figure 1G:
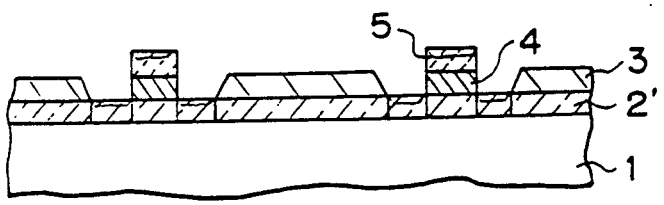

A gate electrode film 5' is placed on the gate film 4' by placing amorphous silicon film 5' (see FIG. 1(c)).

d) Next, The films 4' and 5' are selectively removed through conventional photolithoetching process so that an island of a gate 4 and a gate electrode 5 is obtained (see FIG. 1(d)).

e) Next, one of the windows is covered with a photoresist 6 as shown in FIG. 1(e), and the other window is doped with phosphorus (P) through ion implantation process to provide the area 2P doped with phosphorus in the solid phase growth film 2' for providing a P-channel transistor (see FIG. 1(e)).

Then, that photo-resist 6 is removed, and another photo-resist 7 covers the P-channel transistor. Then, Boron (B) is doped in the second window through ion implantation process to provide the area 2B doped with Boron to provide an N-channel transistor (see FIG. 1(f)). It should be noted that the gate electrode 5 is also doped during the doping process. The gate electrode 5 is conductive.

Then, a CMOS-FET having a P-channel transistor and an N-channel transistor is obtained.

g) After the photo-resist 7 is removed, the product is heated at the temperature 550° C.–600° C. in the nitrogen gas atmosphere for 24 hours so that a dopant is activated, and the solid phase growth process of the gate electrode film 5 is effected.

Figure 1H:
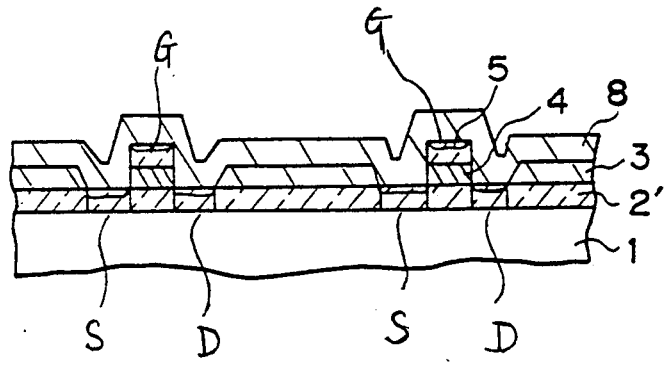

Further, the product is placed under hydrogen gas atmosphere at temperature about 400° C. for about 30 minutes so that the defect state of a semiconductor films is decreased by reducing the density of interface trap. (see FIG. 1(g)).

h) Next, the whole product is covered with the insulation film SiO$_2$ 8 through sputter process (see FIG. 1(h)).

Finally, lead wires for external connection are provided through the conventional steps of providing thin holes on the insulation film 8, placing and patterning aluminium film. The lead wires for a gate electrode G, a source electrode S, and a drain electrode D are provided as shown in FIG. 1(h) through the insulation film 8.

Thus, a CMOS-FET on a glass substrate through low temperature process according to the present invention is completed.

One of the features of the present invention is the use of disilane gas for producing an amorphous silicon film which is subject to solid phase growth to change to non single crystal silicon film through heat treatment in nitrogen gas atmosphere.

The characteristics of the amorphous silicon film with the parameter of gas (disilane gas or conventional silan gas), temperature, heat treatment condition, and film thickness are shown in the table 2, in which the samples 1 through 5 use disilane gas, and the sample 6 uses conventional silane gas.

TABLE 2

| Sample No. | Temperature (°C.) | Heat treat (in N$_2$) | Film thickness (Å) = A | X-ray strength (CPS) = B | B/A | Half-width | Grain diameter (Å) | Resistance ($\Omega \cdot cm^2$) | Carrier density (1/cm$^2$) | Hole mobility (cm$^2$/Vsec) | Oxygen density (1/cm$^3$) |
|---|---|---|---|---|---|---|---|---|---|---|---|
| 1 | 500 | 600° C. × 48 h | 500 | 130.5 | 2.61 | 0.4 | 1000 | $2.5 \times 10^5$ | $1.1 \times 10^{11}$N | 50.0 | less $1 \times 10^{19}$ |
| 2 | 500 | " | 1500 | 38.5 | 2.56 | 0.4 | 2000 | $1.2 \times 10^5$ | $5.7 \times 10^{11}$N | 92.0 | " |
| 3 | 500 | " | 2000 | 504 | 2.52 | 0.4 | 4000 | $5.5 \times 10^5$ | $3.96 \times 10^{11}$N | 28.5 | " |
| 4 | 530 | " | 1100 | 305 | 2.77 | 0.4 | 2000 | $9.2 \times 10^5$ | $8.7 \times 10^{10}$P | 73.2 | " |
| 5 | 530 | " | 2300 | 658 | 2.86 | 0.4 | 9000 | $2.5 \times 10^5$ | $1.0 \times 10^{13}$N | 1.18 | " |

TABLE 2-continued

| Sample No. | Temperature (°C.) | Heat treat (in N₂) | Film thickness (Å) = A | X-ray strength (CPS) = B | B/A | Half-width | Grain diameter (Å) | Resistance ($\Omega \cdot cm^2$) | Carrier density (1/cm²) | Hole mobility (cm²/V·sec) | Oxygen density (1/cm³) |
|---|---|---|---|---|---|---|---|---|---|---|---|
| 6 | 540 | " | 1000 | 123 | 1.23 | 0.53 | 500 | $1.8 \times 10^6$ | $3.7 \times 10^{11}$P | 11.3 | less $10^{20}$ |

The samples 1 through 5 use disilane gas, and the producing conditions are;

| | |
|---|---|
| Si₂H₆ gas | 100 SCCM |
| Pressure | 0.3 Torr |
| He gas | 200 SCCM |

The sample 6 uses silan gas, and the producing conditions are that (20% SiH₄/He) gas; 800 SCCM, and the pressure of 0.8 Torr.

The samples 5 and 6 are out of the present invention, since the sample 5 has too thick film, and the sample 6 uses silane gas (not disilane gas).

When silane gas is used, it should be noted that the oxygen density in the amorphous silicon film or the solid phase growth film is high as shown in the table 2. When the oxygen density is high, a large crystal does not grow. As large crystal is essential in the present invention, the oxygen density in the film 2' must be less than $2 \times 10^{19}/cm^3$. The important factor for providing that low oxygen density is the growth rate of the film 2. The growth rate of the film 2 in the present invention is higher than 50 Å/minute. The growth rate can be controlled by adjusting concentration of disilane gas, and flow rate of disilane gas.

Figure 4:
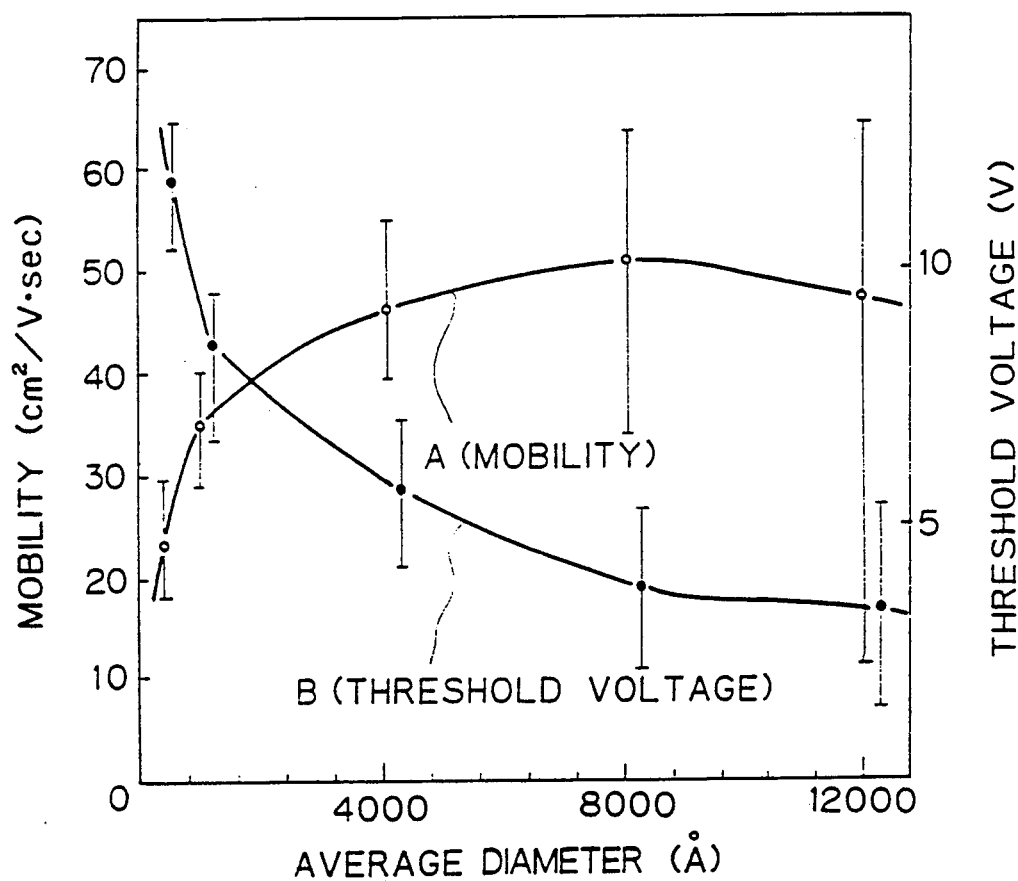
FIG. 4 shows curves of mobility and threshold voltage for each average grain diameter when film thickness is 2000 Å.

FIGS. 2, 3 and 4 show characteristics curves of the mobility and the threshold voltage for each average diameter of a crystal grain in the solid phase growth film 2'. FIG. 2 shows the case that the film thickness is 500 Å, FIG. 3 shows the case that the film thickness is 1000 Å, and FIG. 4 shows the case that the film thickness is 2000 Å. The number of samples in those figures is 10, and the case of P-channel is shown.

It should be noted in FIG. 2 that the mobility decreases suddenly when the average diameter is less than 250 Å, and the mobility distribution widens when the average diameter is larger than 3000 Å. FIGS. 3 and 4 show the similar characteristics.

Theoretically speaking, the mobility $\mu$ is given by the following formula.

$$\mu = L \cdot q \, (\tfrac{1}{2}\pi m^* kT)^{\tfrac{1}{2}} \cdot \exp(-E_B/kT)$$

where L is average crystal diameter, q is electric charge, m* is effect mass, $E_B$ is barrier height of grains, k is Boltzmann's constant, and T is absolute temperature. It has been believed in the above formula that the mobility increases in proportional to the average crystal diameter.

We have found that when the average crystal diameter increases, the interface trap $E_B$ increases also, and the resultant mobility changes as shown in FIGS. 2 through 4. Further, when the average diameter is too large, the dispersion of the number of crystal grains in the solid phase growth film 2' under a gate film of SiO₂ is large, and therefore, the dispersion of the mobility is large.

Figure 5:
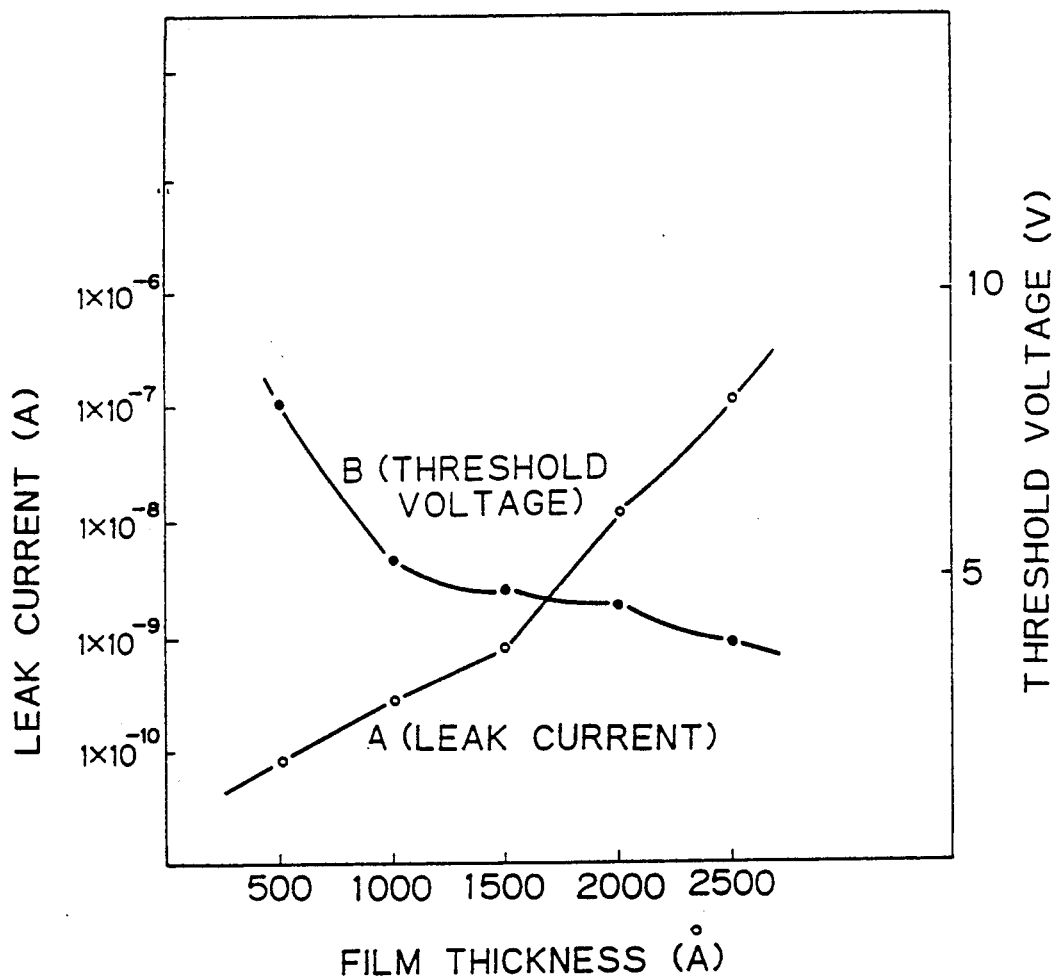
FIG. 5 shows curves of leak current and threshold voltage for each film thickness according to the present invention.

FIG. 5 shows the characteristics of the leak current A which is undesirable current when a transistor is in OFF state, and the threshold voltage B which is necessary gate voltage for switching a transistor, for each film thickness of the film 2'. As shown in FIG. 5, when the film thickness is large, the leak currect A increases. As the leak current is preferable less than $1 \times 10^{-8}$ (A) in a practical device, the film thickness must be less than 2000 Å as far as the leak current concerns. FIG. 5 shows the case of an N-channel transistor.

As analyzed above, the film thickness is preferably larger than 500 Å in view of the mobility, and smaller than 2000 Å in view of the leak current. The threshold voltage in those conditions of film thickness is less than 8 V as shown in the curve B of FIG. 5.

We have concluded in the FIGS. 2, 3 and 4, and the table 2 that the film thickness is preferably in the range between 500 Å and 2000 Å, and the diameter of a crystal grain in the film 2' is preferably in the range between ½ times, and 4 times of the film thickness.

Figure 6A:
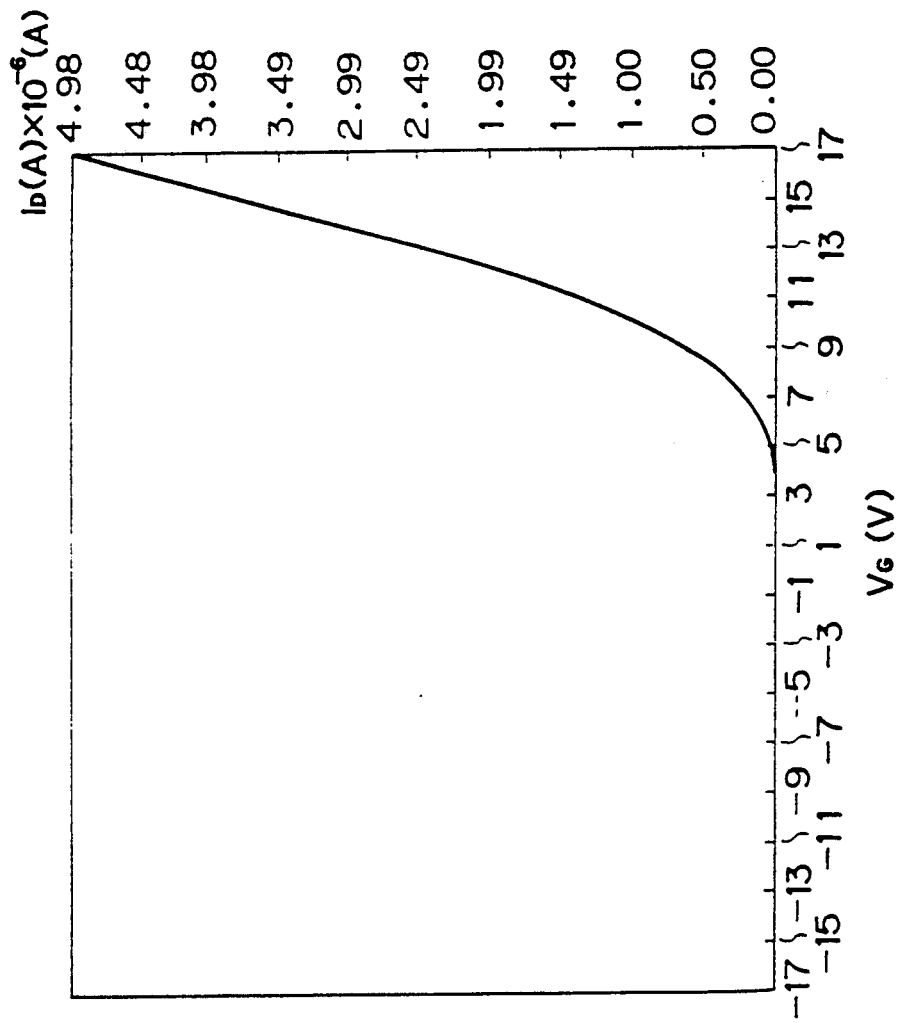
FIG. 6(a)-6(b) shows characteristics curves between gate voltage $V_G$ and drain current $I_D$ of a transistor according to the present invention.
Figure 6B:
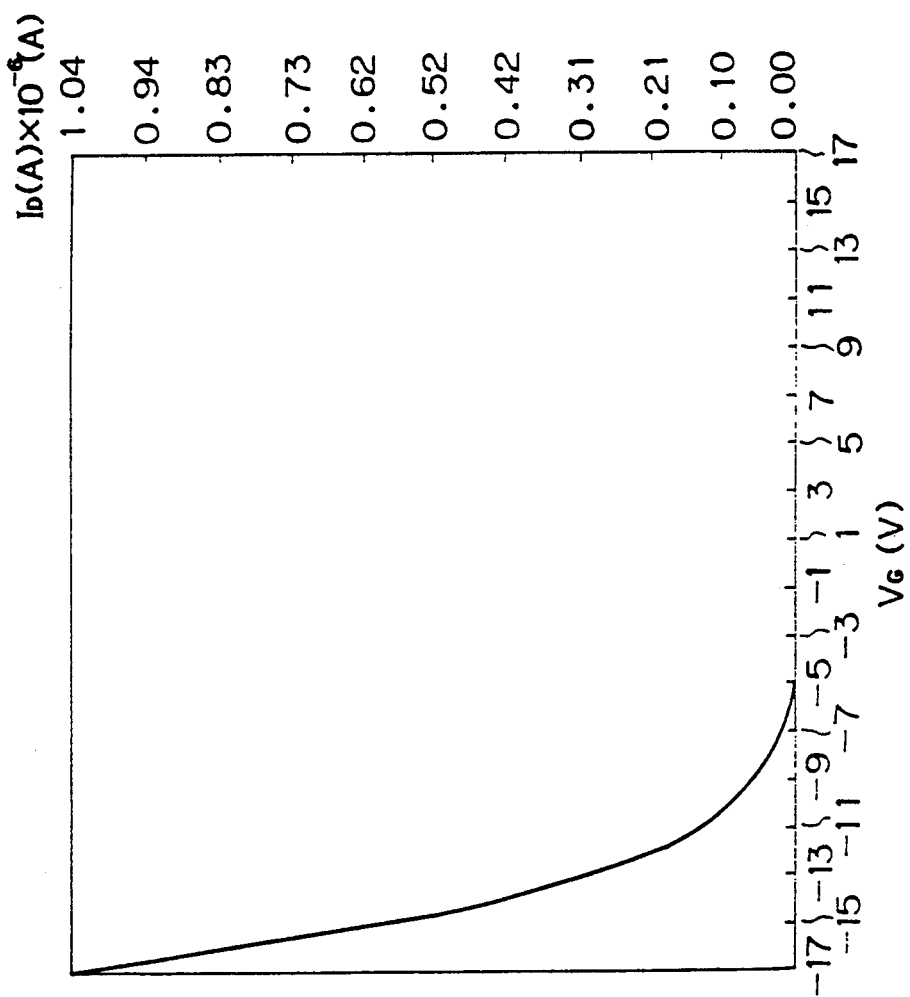

FIG. 6 shows the $V_G$–$I_D$ (gate voltage—drain current) characteristics of the present MOS-FET produced on a non single crystal semiconductor film. FIG. 6(a) shows the case of a P-channel transistor, and the mobility of 50 cm²/V·sec is obtained. FIG. 6(b) shows the case of a P-channel transistor, and the mobility of 24 cm²/V·sec is obtained.

Figure 7A:
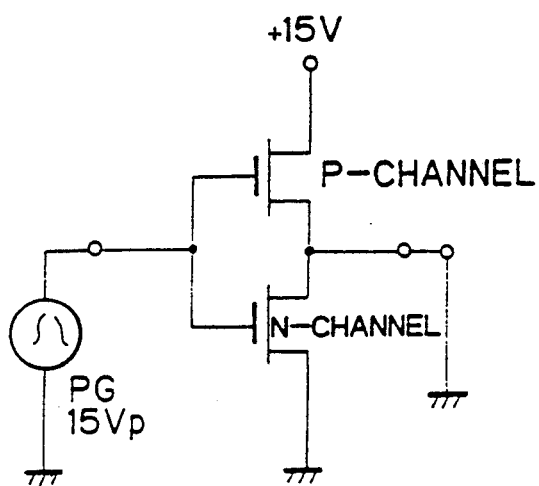
FIG. 7(a)-7(b) shows a circuit diagram and its characteristics curves according to the present invention.
Figure 7B:
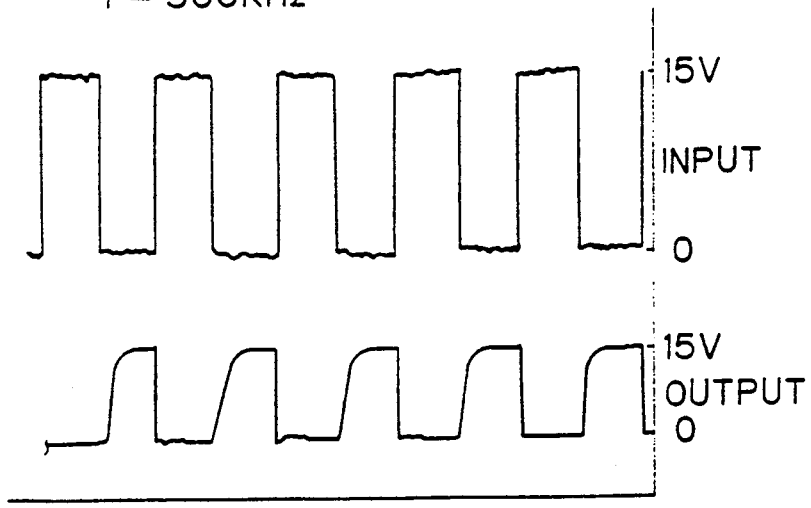

FIG. 7 shows a circuit diagram of a C-MOS inverter, and the operational waveforms of the same. It should be appreciated that the present C-MOS inverter operates with enough switching speed of 500 kHz, which is satisfactory operational speed for the use of an image sensor. The glass substrate in FIG. 7 is LE30 (trade name) produced by Hoya Glass Company in Japan. The ratio of the channel width W and the channel length L of the CMOS-FET in FIG. 7 is L/W=5/20.

As described above in detail, the present invention which produces a thin film transistor in non single crystal semiconductor film which is produced on a glass substrate through low temperature process using disilane gas, provides a thin film transistor with high mobility which is higher than 20 cm²/V·sec in P-channel, and higher than 50 cm²/V·sec in N-channel, and the threshold voltage is lower than 10 V.

The present invention is applicable to a high speed switching device, an image sensor, and/or liquid crystal screen.

Figure 8:
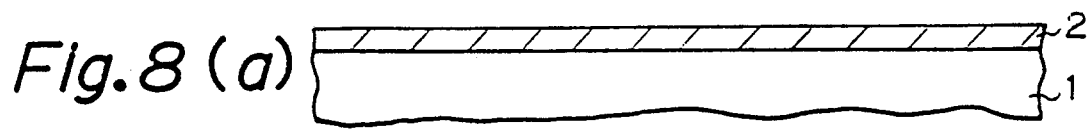
FIG. 8(a)-8(j) shows producing steps of an image sensor according to the present invention.
Figure 8:
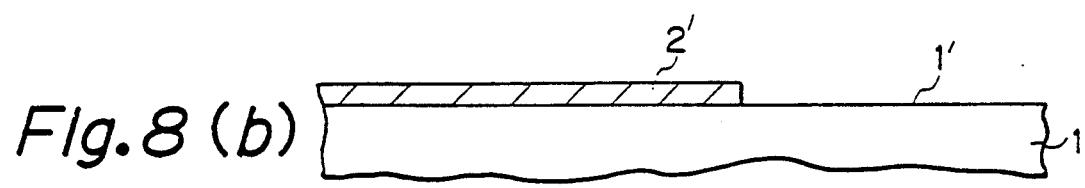
Figure 8:
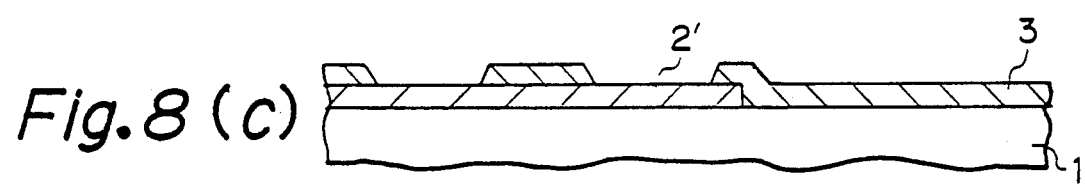
Figure 8:
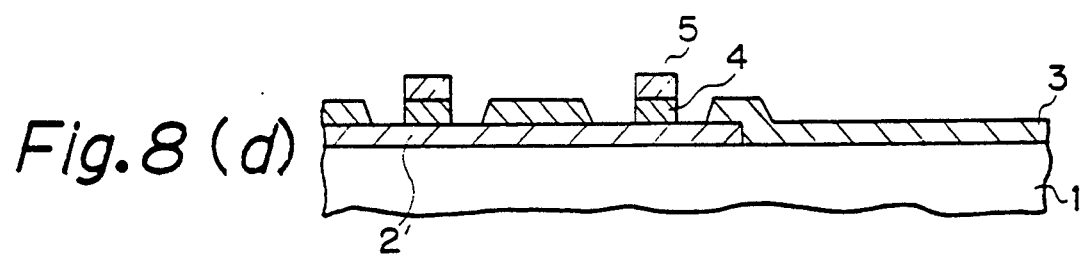
Figure 8:
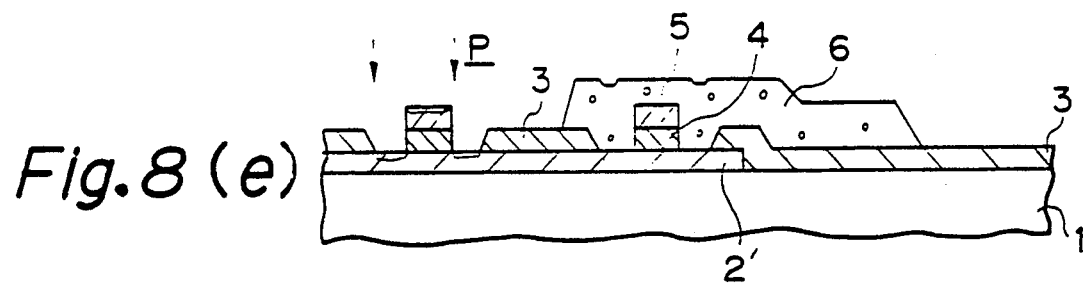
Figure 8:
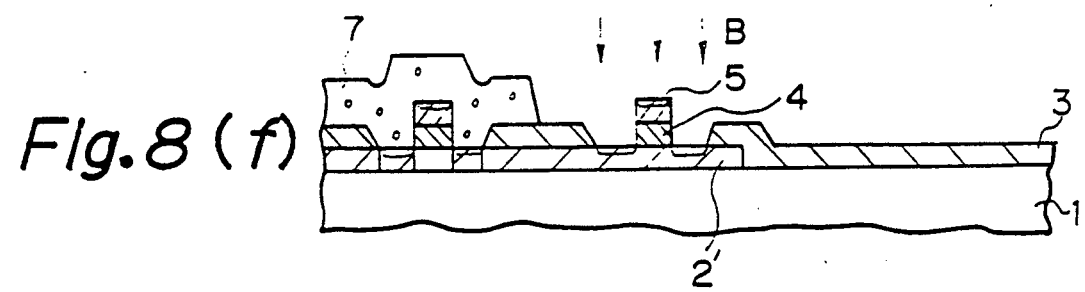
Figure 9:
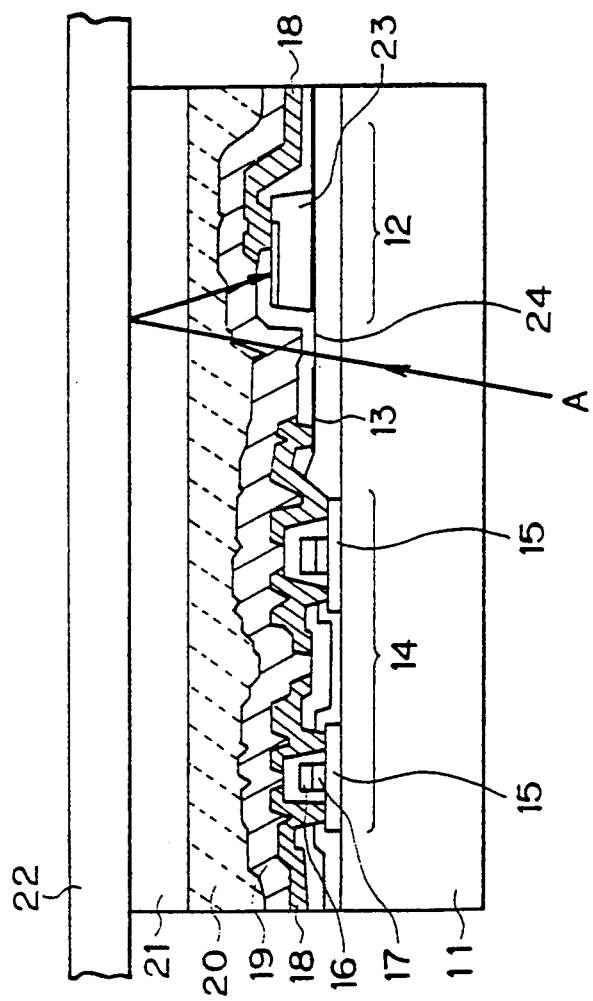
FIG. 9 shows a cross section of an image sensor.
Figure 10:
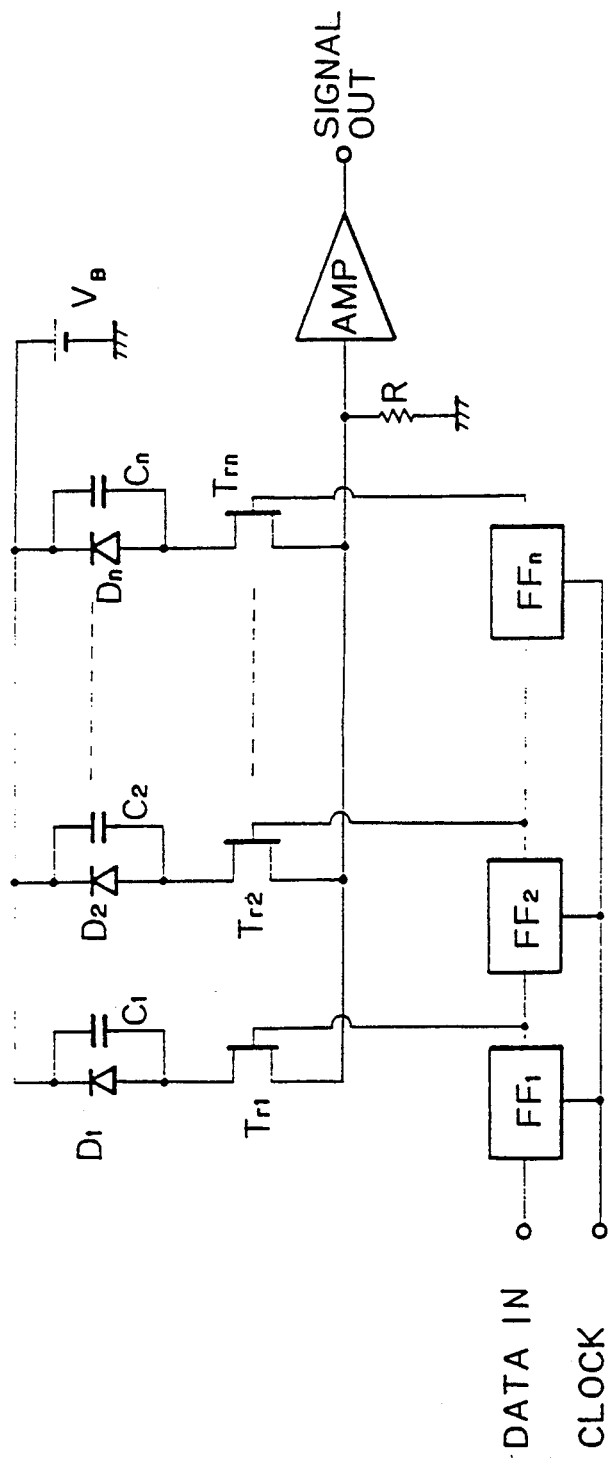
FIG. 10 shows a circuit diagram of an image sensor.

Next, the second embodiment of the present invention is described in accordance with FIGS. 8 through 10, which relate to an image sensor for reading a document in a facsimile apparatus. In FIG. 9, the numeral 11 is a glass substrate, 12 is a sensor section, 13 is an opaque shadow film, 14 is a thin film transistor section, 15 is a non single crystal (solid phase growth silicon section, 16 is a gate electrode, 17 is a gate oxide film, 18 is a conductive (aluminium) electrode, 19 is a protection film, 20 is an adhesive, 21 is a thin transparent plate, 22 is a document which is subject to read, 23 is a sensor element, and 24 is an illumination window.

The image sensor of FIG. 9 is a so-called contact type in which an image sensor and a document 22 contact directly.

A light beam A illuminates the document 22 through the window 24, and the reflection beam reflected by the document 22 is read or converted to electrical signal by the sensor section 12.

Each cell of the sensor section 12 comprises a sensor element 23, and a plurality of thin film transistors (TFT) which include a switching element for operating said sensor element.

FIG. 10 shows a circuit diagram of an image sensor, which comprises a photo-diode Di, a switching transistor $T_{ri}$ for operating said photo-diode, and a flip-flop FFi for operating said switching transistor. The outputs of the photo-diodes are obtained at the signal output terminal through an amplifier AMP. The photo-diodes (photo sensor), and the related transistors (switching transistors and flip-flops) are produced on a non single crystal silicon film on a glass substrate according to the present invention.

FIG. 8 shows the producing steps of the circuit of FIG. 10, and only one photo sensor and a pair of transistors are shown for the sake of the simplicity.

The producing steps of the device of FIG. 9 is described in accordance with FIG. 8.

First, the glass substrate 1 with the amorphous silicon layer 2 is prepared as is the case of FIG. 1(a) (see FIG. 8(a)).

Next, the amorphous silicon film 2 is processed through solid phase growth to the solid phase growth film 2' as is the case of FIG. 1(b). The chemical conditions for solid phase growth is the same as that of FIG. 1(b). The film 2' is subject to photolithoetching process to provide an island 2' on which thin film transistors are provided (see FIG. 8(b)).

The right portion where no film 2' exists is the section for depositing a photo sensor.

Next, the whole surface of the substrate is covered with SiO₂ film 3 through RF sputter process, and then, windows are provided on said SiO₂ film for the area of a thin film transistor (see FIG. 8(c)). A P-channel transistor and an N-channel transistor are provided in said windows as shown in FIGS. 8(d) through 8(f). Those processes are the same as those in FIGS. 1(b) through 1(g).

Figure 8G:
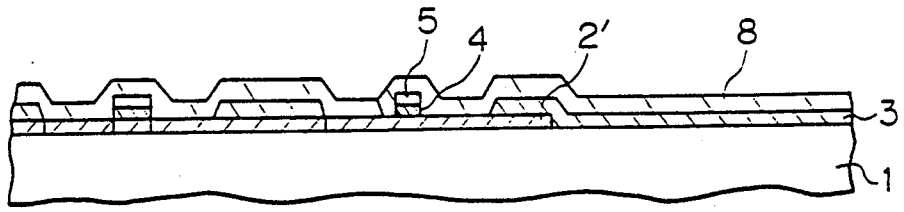

After the transistors are provided, the whole area is covered with SiO₂ film 8 as shown in FIG. 8(g), so that a photo sensor is provided at right half section of FIG. 8(g).

A conductive film 9 made of chromium (Cr) is deposited on the film 8. The conductive film 9 functions both as a shadow film 13, and as one of electrodes of a photo-sensor.

Figure 8H:
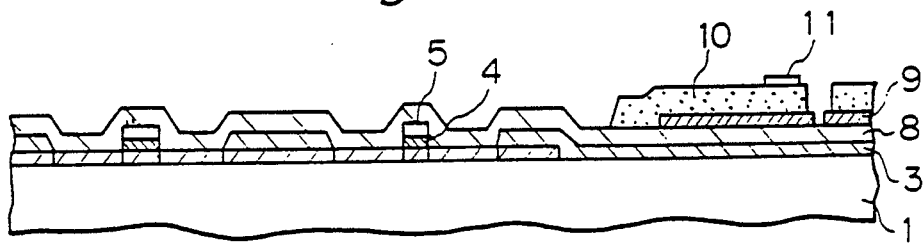

A PIN structure (Positive Intrinsic Negative Semiconductor structure) 10 which operates as a diode or a photo-sensor is deposited on the conductive film 9. That PIN structure is an amorphous silicon film which is not subject to solid phase growth. An ITO film (Indium Tin Oxide) 11 is deposited on the PIN film 10. That film 11 functions as a transparent electrode. Thus, a photo-sensor having a transparent electrode 11, a PIN structure 10, and the other electrode 9 is completed (FIG. 8(h)).

Figure 8I:
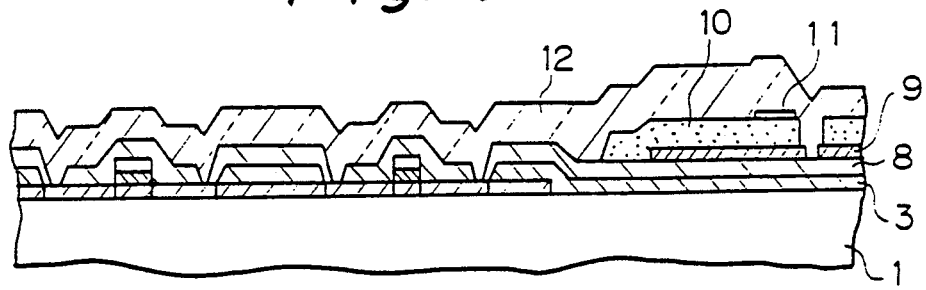
Figure 8J:
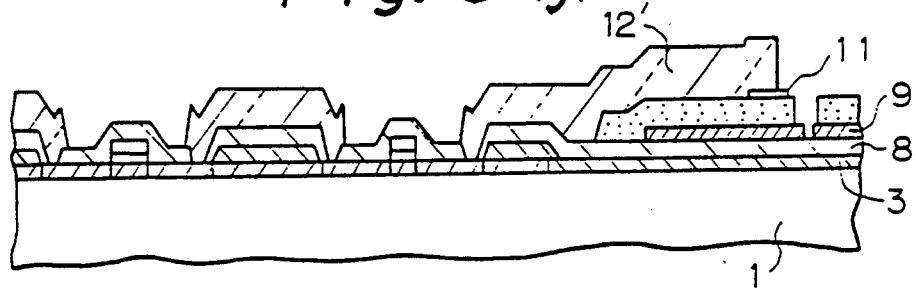

Next, The SiO₂ film 8 is provided with through holes through photolithoetching process, and then, a conductive film 12 which comprises a first chromium film with about 1000 Å thickness and a second aluminium film of about 1 μm thickness is placed on the insulation film 8. The conductive film 12 is shaped to the wiring pattern for coupling each of the elements on the substrate through wet etching process (FIG. 8(i)) so that a wire lead 12' couples each of the elements (FIG. 8(j)). Thus, a TFT portion on left half section in the drawing, and a photo sensor section on right half section in the drawing are completed.

From the foregoing it will now be apparent that a new and improved semiconductor device has been discovered. It should be understood of course that the embodiments disclosed are merely illustrative and are not intended to limit the scope of the invention. Reference should be made to the appended claims, therefore, for rather than the specification as indicating the scope of the invention.

What is claimed is:

1. A method for producing a non single crystal semiconductor device comprising the steps of;

placing amorphous silicon film on a glass substrate through low pressure CVD process using disilane gas, effecting solid phase growth to said amorphous silicon film by heating said substrate together with said film in nitrogen gas atmosphere to obtain a film having a thickness in the range 500 Å to 200 Å, and crystal grains in said silicon film having an average diameter int he range 250 Å to 8000 Å, and an oxygen density in said film of less than $2 \times 10^{19}/cm^3$, producing an insulation film on said solid phase growth film, implanting donor into said solid phase growth film around said insulation film for a source and a drain of a transistor, and placing a conductive film on said insulation film as a gate electrode.

2. A method according to claim 1, wherein temperature for said solid phase growth is in the range between 550° C. and 600° C., and the duration for that solid phase growth is in the range between 8 hours and 56 hours.

3. A method according to claim 1, wherein growth rate of said amorphous silicon film is in the range between 50 Å/minute and 500 Å/minute.

4. A method according to claim 1, further comprising the step of depositing a photo sensor which has PIN structure including the steps of;

depositing a first conductive film which has a window for a light path on said substrate adjacent to a transistor area, depositing amorphous silicon film which has PIN structure selectively on said first conductive film, depositing second conductive transparent film on said amorphous silicon film, so that a photo-sensor is obtained by said first conductive film, said amorphous silicon film which has PIN structure, and said second conductive film, and effecting wirings between said photo-sensor and said transistors and external circuitry.

* * * * *

UNITED STATES PATENT AND TRADEMARK OFFICE
CERTIFICATE OF CORRECTION

PATENT NO. : 5,298,455
DATED : March 29, 1994
INVENTOR(S) : Arai et al.

It is certified that error appears in the above-identified patent and that said Letters Patent is hereby corrected as shown below:

Column 8, line 27 "200 Å" should be --2000 Å--

Column 8, line 29 "int he" should be --in the--

Signed and Sealed this

Twenty-fourth Day of January, 1995

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,298,455
DATED : March 29, 1994
INVENTOR(S) : Michio Arai et al.

It is certified that error appears in the above-indentified patent and that said Letters Patent is hereby corrected as shown below:

Title Page, [73] Assignee: After "TDK Corporation, Tokyo, Japan" insert --and Semiconductor Energy Laboratory Co., Ltd., Kanagawa, Japan--

Signed and Sealed this

Twenty-fourth Day of March, 1998

Attest:

BRUCE LEHMAN

*Attesting Officer*  *Commissioner of Patents and Trademarks*